United States Patent [19]
Halligan

[11] 3,945,408
[45] Mar. 23, 1976

[54] APPARATUS FOR FORMING AND TRIMMING THE LEADS OF ELECTRONIC COMPONENTS

[76] Inventor: Dewey D. Halligan, 6251 Empress Court, San Jose, Calif. 95129

[22] Filed: June 3, 1974

[21] Appl. No.: 475,563

[52] U.S. Cl.............................. 140/105; 72/DIG. 10
[51] Int. Cl.² ......................................... B21F 45/00
[58] Field of Search ................. 140/147, 105, 71, 1; 72/DIG. 10

[56] References Cited
UNITED STATES PATENTS

| 3,144,889 | 8/1964 | Cole | 140/147 |
|---|---|---|---|
| 3,147,779 | 9/1964 | Brown | 140/105 |
| 3,225,797 | 12/1965 | Stoody | 140/147 |
| 3,427,849 | 2/1969 | Ainsworth et al. | 140/105 |
| 3,520,335 | 7/1970 | Patterson | 140/147 |
| 3,525,372 | 8/1970 | Haven | 140/147 |
| 3,796,201 | 3/1974 | Golub | 140/105 |
| 3,857,420 | 12/1974 | Newman | 140/105 |

*Primary Examiner*—Lowell A. Larson
*Attorney, Agent, or Firm*—Schatzel & Hamrick

[57] ABSTRACT

Apparatus for processing electronic components such as transistors, and the like, having a plurality of wire leads extending from a potted body, and including a gravity feed guide, a metering device for feeding the transistors one-at-a-time to a work station, positioning devices for positioning each transistor fed to the work station in a predetermined orientation, a mating die assembly and forming and cutting assembly for forming the transistor leads into a predetermined configuration and cutting the formed leads to a predetermined length, and a sequencing system for actuating each of the operative devices in a predetermined order.

6 Claims, 11 Drawing Figures

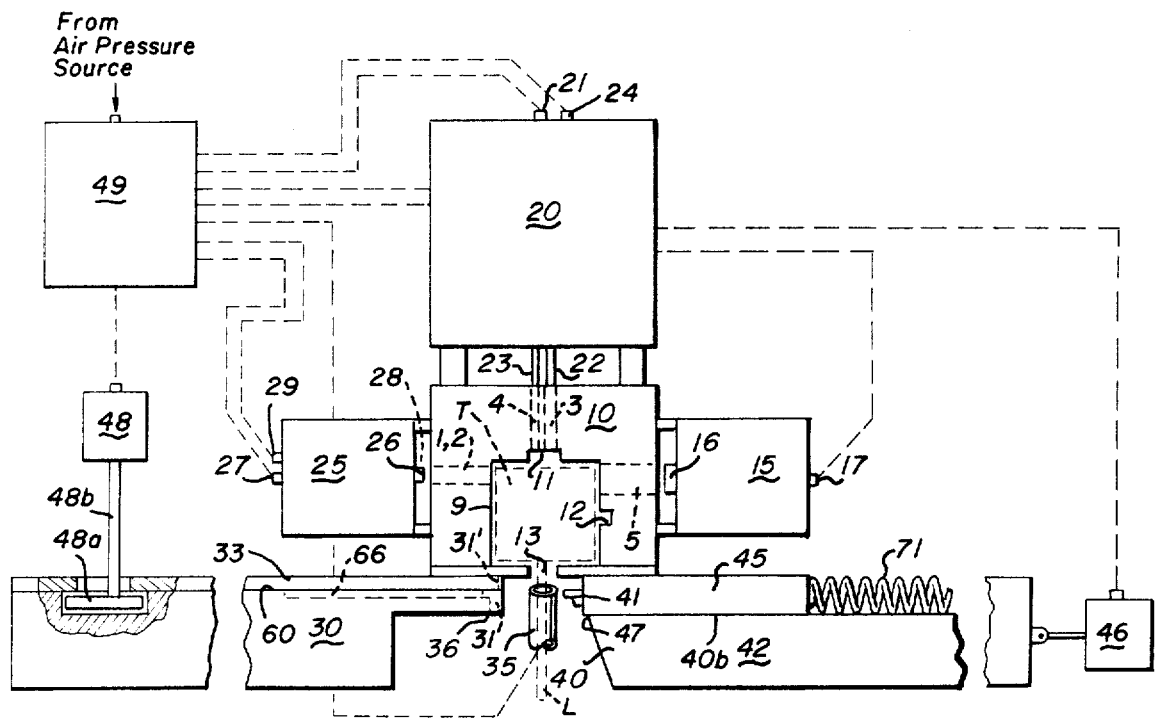
Fig_1a
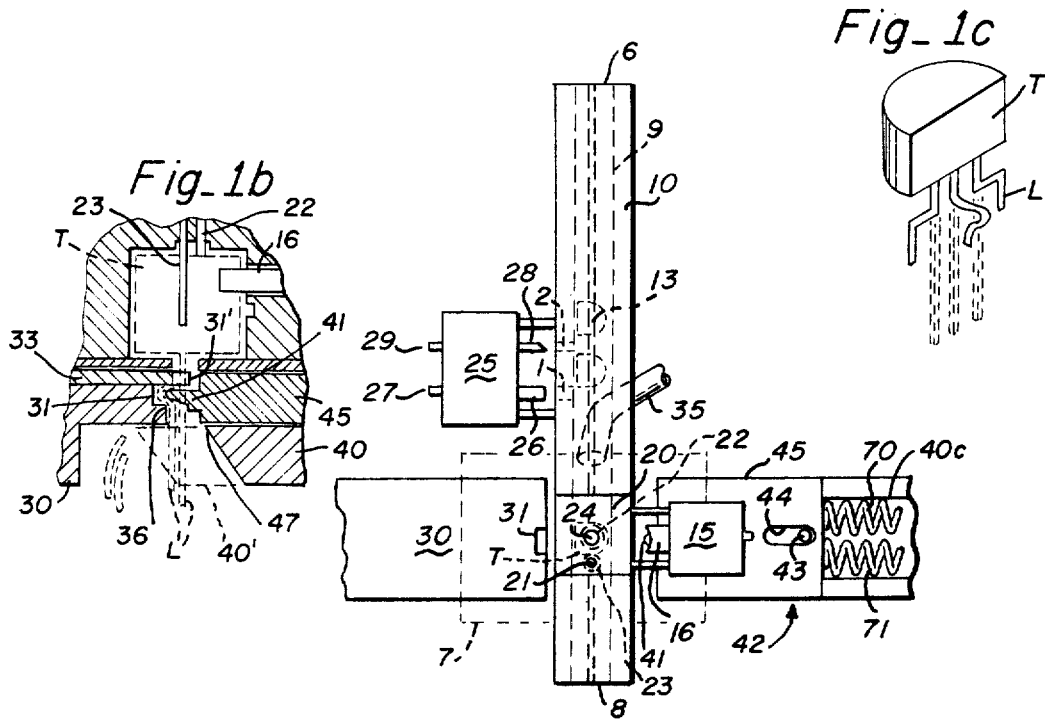
Fig_1b
Fig_1c
Fig_2

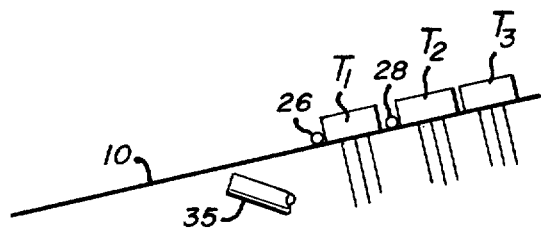
Fig_6
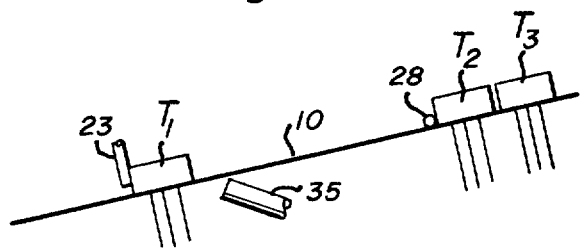
Fig_7
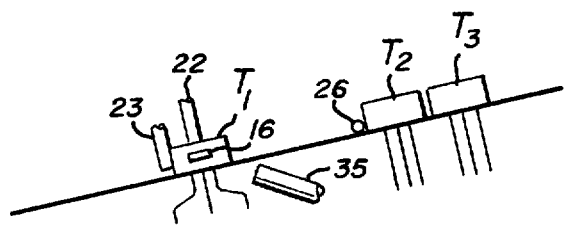
Fig_8
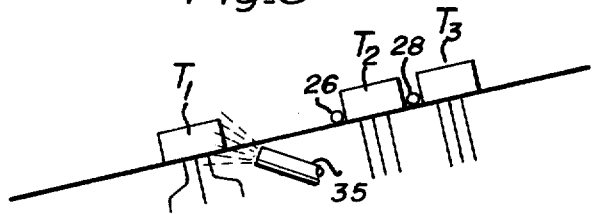
Fig_9

APPARATUS FOR FORMING AND TRIMMING THE LEADS OF ELECTRONIC COMPONENTS

BACKGROUND OF THE INVENTION

1. Field of the Invention

The present invention relates generally to electronic component processing apparatus and more particularly to an apparatus for forming and trimming the lead wires of transistors and the like.

2. Description of the Prior Art

The development and rapidly expanding extensive use of the transistor in the past decade has brought mass-production techniques for the rapid production of them. The manufacturers of these types of electrical components customarily produce and supply them with long leads which are then cut and formed by the user for mounting in his particular electronic circuit. It is quite common to find in the same electronic circuit many of the same value transistors each with a different requirement for the length, shape and spacing of the lead wires. These requirements include forming an offset in the lead sufficient to provide a shoulder at a given point as the lead is mounted in a hole in a printed circuit board. In this manner the transistor may be suspended above the board so that it will not be subjected to all the vibrations of the board or to all the heat of soldering. At other times the leads are spread in a specified shape for such reasons as to reduce the possibility of short circuiting of the soldered points to the printed board. As the quality and quantity of applications of transistors to electronic circuits increase the greater is the need for the automatic cutting and forming device of this invention and for precisely cutting the leads to a determined length and to spread and bend the leads to a precise shape and location.

The widespread use of transistors in the multitude of electrical circuits such as radio, television, computers and like assemblies require that the transistors be made to fit economically in the various assembly processes. Among these processes are those using printed circuit systems in which boards and other mounting arrangements having wire receiving holes of precise location which are provided for the mounting therein of the lead wires of the transistors. In the design of these electrical circuits it is necessary that the lengths of the leads of the transistors be made of a predetermined length, configuration and spacing so that all the components will fit and operate in the circuit in a determined manner. Much thought and consideration, building of apparatus and the like has been done to cut the leads to a determined length and then bend them so that they will fit into the mounting holes in a determined manner.

The cutting of wire leads on transistors and the like is exemplified in U.S. Pat. No. 2,571,078 to J. Vollmer on Oct. 9, 1951; U.S. Pat. No. 2,923,189 to F. J. Zoschg on Feb. 2, 1960; U.S. Pat. No. 3,071,166 to E. A. Gutbier on Jan. 1, 1963; U.S. Pat. No. 3,075,562 to A. A. Jankowski on Jan. 29, 1963; U.S. Pat. No. 3,144,889 to T. H. Cole on Aug. 18, 1964; and U.S. Pat. No. 3,799,017 to D. D. Halligan on Mar. 20, 1974.

An apparatus for orienting, feeding, transporting to locations whereupon the leads can be cut and subsequently bent to a shape and spacing is exemplified in U.S. Pat. No. 3,396,758 to R. L. Hill on Aug. 13, 1968.

SUMMARY OF THE PRESENT INVENTION

The principal object of the present invention is to provide an improved electronic component processing apparatus for automatically forming and trimming the lead wires of transistors and the like.

Briefly, the preferred embodiment includes an elongated guide for transporting the transistors to a work station by gravity feed, a metering device for feeding the transistors to the work station one-at-a-time, positioning devices for receiving and causing each transistor fed to the work station to have a predetermined orientation, a die assembly and a forming and cutting assembly disposed at the work station for forming and trimming the lead wires of each positioned transistor, and apparatus for actuating each of the various operative components of the apparatus in a predetermined sequence.

An important advantage of the present invention is that it automatically forms and trims electronic component leads at a high rate using mechanism that are mechanically simple and thus highly reliable.

Another advantage of the present invention is that the lead forming and trimming operation is performed simultaneously at a single work station thereby assuring process uniformity.

These and other objects and advantages of the present invention will no doubt become apparent to those of ordinary skill in the art after having read the following detailed description of a preferred embodiment which is illustrated in the several figures of the drawing.

IN THE DRAWING

FIG. 1a is a partially broken diagrammatic front view showing the principal operative components of a preferred embodiment of the present invention;

FIG. 1b is a partial cross-section taken transversely through the work station to illustrate the lead forming and cutting operation of the apparatus illustrated in FIG. 1a;

FIG. 1c is a perspective view showing a transistor having its wire leads formed and cut by the apparatus illustrated in FIG. 1a;

FIG. 2 is a partially broken top view of the preferred embodiment shown in FIG. 1a;

FIG. 3 is a cross-section illustrating the operative structure of one of the positioning components shown in FIG. 1a;

FIG. 4 is a plan view showing details of the die and lead forming and trimming assemblies used in the embodiment of FIG. 1a;

FIGS. 6–9 are diagrams sequentially illustrating operation of the present invention.

DETAILED DESCRIPTION OF THE PREFERRED EMBODIMENT

Figure 3:
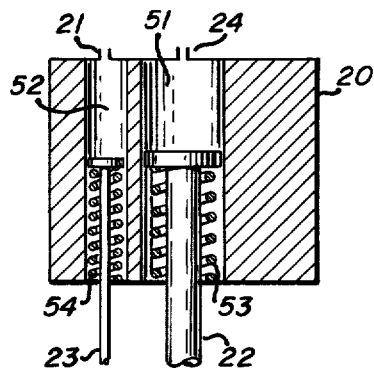

FIG. 1a of the drawing diagrammatically illustrates the principal operative components of a lead forming apparatus in accordance with the present invention. The illustration is a view looking toward the exit end of an elongated guide 10 which forms a passageway 9 for transporting electronic components such as the transistor T from an entry end 6 (see FIG. 2) passed a work station 7 to the exit end 8. FIG. 2 is a partial top view of the apparatus shown in FIG. 1a and is slightly reduced in scale with assemblies 30 and 42 shown moved apart in the lateral direction for clarity.

Guide 10 is essentially elongated hollow tube having a plurality of openings in its top and side walls as indicated by the dashed lines 1–5 to provide access ways for the various transistor handling detents. Guide 10 also has a slit 13 in its bottom side extending from the entry end to the exit end and through which the lead L of the transistor T project as the transistor is allowed to move along passageway 9. Although not indicated in FIG. 1a, the entry end 6 of guide 10 is elevated relative to exit end 8 so that the transistors are gravity fed through passageway 9. The interior surfaces forming passageway 9 also include insets 11 and 12 which extend along the length of guide 10 to provide clearance for molding imperfections in the body portions of the transistors. As will be explained in more detail below, the present embodiment is particularly adapted to process transistors and other electronic components having three leads and a body which is normally flat on top and bottom, and has at least one rounded side and one opposite side which is flat as illustrated in FIG. 1c.

The work station 7 includes a pneumatically actuated lateral and longitudinal (relative to passageway 9) positioning component 15, a stop and vertical positioning component 20, a die assembly 30, and a forming and cutting assembly 42. In addition, a transistor expelling air jet 35 is positioned beneath guide 10. Each of these components with the exception of die assembly 30 is pneumatically actuated by a pneumatic sequencer 49 which is driven by an electrical motor 48. Die assembly 30 is actuated directly by motor 48 via a cam 48a affixed to the motor shaft 48b.

Component 20 is mounted to the top of guide 10 and includes a rod shaped detent 23 which enters guide 10 through an opening 4 and extends into passageway 9 to stop an article passing therethrough. Component 20 also includes a rod shaped detent 22 which enters guide 10 through an opening 3 to engage the top surface of a positioned transistor T stopped by detent 23.

FIG. 3 shows the basic construction of component 20 wherein the stop detent 23 and the top engaging detent 22 are formed by the piston rods of a dual acting pneumatic actuator. Stop detent 23 is normally held in a neutral position by a spring 54 and detent 22 is normally held in its neutral position by a spring 53. Air pressure applied to cylinders 51 and 52 through inlets 24 and 21, respectively, cause the associated pistons to drive the detents 22 and 23 through openings 3 and 4 in passageway 9. When the air pressure is removed from the cylinders, springs 53 and 54 return the pistons to their neutral positions withdrawing detents 22 and 23 from passageway 9.

Positioning component 15 likewise includes a pneumatically actuated piston and detent 16 which extends into passageway 9 through an opening 5. However, detent 16 differs from detents 22 and 23 in that its transistor engaging end surface is concave-shaped to mate with the rounded side surface of a transistor T and to pin the flat side of the transistor against the opposite wall of passageway 9.

The positioning components 15 and 20 cooperate with each other to locate and position the transistors at the work station in the following manner: Detent 23 is first actuated to extend into passageway 9 to stop the transistor as it moves along the guide. Detent 16 is then actuated to mate with the rounded side surface of the transistor and to cause its flat side to be pinned against the flat opposite wall of passageway 9. This engagement simultaneously positions the transistor in both the lateral and longitudinal directions (relative to passageway 9). More particularly, the mating of the concave face of detent 16 with the rounded side surface of the transistor insures longitudinal positioning accuracy, while the abutting relationship between the flat side of the transistor and the passageway sidewall insures accurate lateral positioning. Detent 22 is then actuated and engages the top surface of the transistor to press its flat bottom surface against the bottom surface of passageway 9 thereby insuring accurate alignment in the vertical direction. With transistor T thus positioned, the wire leads L are properly aligned for engagement by die assembly 30 and cutting and forming assembly 42.

The metering component 25 is comprised of a pair of pneumatically actuated cylinders similar to those illustrated in FIG. 3 which independently cause rod shaped detents 26 and 28 to be thrust through openings 1 and 2 into passageway 9 in response to air pressure applied to ports 27 and 29, respectively. To perform the metering operation detent 26 is first inserted into passageway 9 to block passage of a series of the transistors and detent 28 is then inserted inbetween the first and second transistors in the series. Note that its tip is wedge-shaped to facilitate such insertion. The thus captured transistor may then be released to the work station by retracting detent 26. The next component is then moved into position and made ready for release by again actuating detent 26 and retracting detent 28. As soon as the next transistor has fallen into place, detent 28 is again actuated to segregate it from the following transistors.

Figure 4:
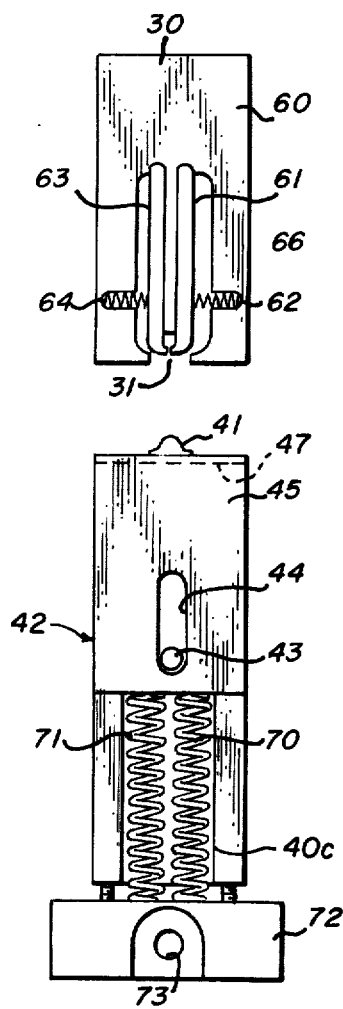

After a transistor is properly positioned at work station 7, as previously described, work may be performed upon the leads extending through slot 13 by actuating the assemblies 30 and 42. Referring now to FIGS. 1a and 2 and the upper portion of FIG. 4, it will be noted that die assembly 30 is comprised of a base block 60 having an elongated cavity 66 formed in its upper surface with one end of the cavity being open to a notched portion of block 60. Disposed within cavity 66 are a pair of forming members 61 and 63 which have lead engaging ends respectively, and are mounted to pivot about their opposite ends. Members 61 and 63 are biased into the position illustrated in FIG. 4 by the springs 62 and 64, respectively. Disposed upon the top surface of block 60, as illustrated in FIG. 1a, is a cover plate 33 which has a lead engaging notch 31' provided in the forward end thereof. Notch 31' is narrower than, but is centered relative to the notch 31 in block 60. The combination of notches 31 and 31' form a die cavity to form the transistor leads in the mannner illustrated in FIG. 1c. The lowermost edges 36 of notch 31 lead length determining shoulders. Assembly 30 is moved between the retracted position illustrated in FIGS. 1 and 4 and the lead engaging position illustrated in FIG. 5 by the cam 48a as it is driven by motor 48.

The forming and cutting assembly 42 is comprised of an elongated cutting element 40 having a beveled end surface 40a (FIG. 1a ) forming a shearing edge 47, and a flat upper surface 40b with a longitudinally extending recess 40c provided therein. The opposite end of element 40 is connected to a pneumatic actuator 46 which causes assembly 42 to be moved between the retracted position illustrated in FIGS. 1a and 4, and the working position illustrated in FIGS. 1b and 5.

Mounted to the top of cutting element 40 is a forming member 45 having a bottom projection (not shown) for mating with recess 40c (FIG. 2) to permit aligned parallel movement of member 45 relative to element 40. Member 45 has a lead engaging shaping element 41 projecting from its leading side, and has a pair of springs 70 and 71 affixed to its trailing side to bias member 45 into the rest position shown in FIGS. 1a and 4. Springs 70 and 71 permit member 45 to move along recess 40c relative to element 40 as will be described below.

The particular illustrated configuration of shaping element 41 is such as to mate with the particular configuration of die assembly 30 so as to shape the die stamped leads of transistor T in the manner illustrated in FIG. 1c. These elements could quite clearly have other configurations for causing other lead forms to be produced.

Figure 5:
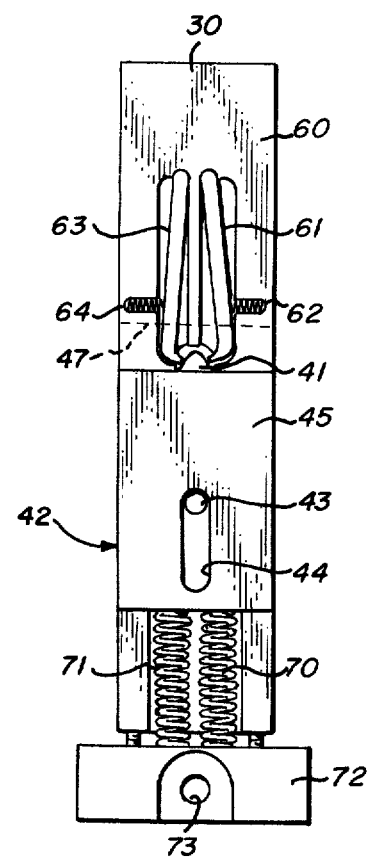
FIG. 5 is a plan view of the apparatus of FIG. 4 shown in the actuated position.

Referring now to FIGS. 1b and 5, the forming and trimming operation of the preferred embodiment will be described in detail. Once the transistor T is locked in position at the work station by positioning devices 15 and 20, can 48a causes assembly 30 to move into engagement with leads L. In this position, leads L are received within the notches 31 and 31'. Pressurized air is then applied to actuator 46 by sequencer 49 causing assembly 42 to move leftwardly as illustrated, so that shaping element 41 is driven into engagement with the leads L to deform them into the die cavity of assembly 30. Note that the centermost lead is deformed in the lateral direction relative to passageway 9 while the outside leads are deformed in the longitudinal direction as illustrated in FIG. 1c.

Although not clearly shown in the drawing, it must be understood that notch 31' in plate 33 prevents deformation of the lead portions received therein while notch 31 and the ends 33 and 35 (see FIGS. 4 and 5) of members 61 and 63, respectively, cooperate with shaping element 41 to form the lead portions received therein. Note that the outside leads are spread along with members 61 and 63 (FIG. 5) as they are engaged by element 41. As forming member 45 bottoms out against the end surface of die assembly 30, its movement will terminate, but cutting element 40 will continue to move toward assembly 30 as illustrated by the dashed lines 40' in FIG. 1b. In moving as illustrated, shearing edge 47 cooperates with the shoulders 36 to shear the formed leads L.

As indicated in FIGS. 1a and 2, the air tube 35 is positioned beneath guide 10 and directed at the work station 7 so as to assist in the discharge of a transistor from the work station after it has been worked upon. Although not necessarily required, in that the component will normally be discharged from the guide due to its own weight, it has been found that a short burst of air will speed the discharge operation and prevent the possible jamming of the apparatus.

Referring now to FIGS. 6-9, the overall operational sequence of the above described apparatus will be explained using the illustrated simplified sequence of diagrams. In these diagrams, the line 10 is used to represent guide 10 while the other numbered elements are used to represent the like numbered, previously described elements. In FIG. 6, three transistors $T_1$, $T_2$ and $T_3$ are shown at the upper end of the guide with transistor $T_1$ being already positioned between detents 26 and 28. The first step in the sequence, as determined by pneumatic sequencer 49, is to actuate stop detent 23 and retract detent 26 thereby allowing transistor $T_1$ to be gravity fed to the work station position as illustrated in FIG. 7. Detents 16 and 22 are then actuated to position transistor $T_1$, and assemblies 30 and 42 (not shown) are actuated to form and trim the transistor leads as shown in FIG. 8. During this time, detent 26 is actuated and detent 28 is retracted to allow transistors $T_2$ and $T_3$ to move down the guide into position adjacent detent 26. Detent 28 is then again actuated to segregate the transistor $T_2$; detents 16, 22 and 23 are retracted to free transistor $T_1$; and a short blast of air is directed upon transistor $T_1$ causing it to be discharged from the work station as indicated in FIG. 9. The sequence is then repeated in cyclical fashion until all transistors have had their leads formed and trimmed.

Although the illustrated preferred embodiment uses pneumatic actuators, it is to be appreciated that electrical actuators could likewise be used along with an electrical signal sequencer which would also be driven by the shaft of motor 48. In either case the apparatus will have the advantage that all operative components with the exception of the die assembly 30 are driven by a system that is not mechanically linked thereto and therefore no mechanical slippage or skipping is encountered which will cause the machine to deviate from its prescribed sequence of operation.

In the preferred embodiment, it has been found that positioning means of the type illustrated are capable of positioning a component within plus of minus 0.001 inch of a desired reference position. Moreover, since all operative elements of the apparatus, with the exception of the die assembly 30, are controlled by the pneumatic sequencer 49 and both the pneumatic sequencer and the die assembly 30 are driven by a single motor 48, it will be appreciated that the upper limit of operational speed is determined primarily by the gravity fall rate of the components rather than by the operational characteristics of the apparatus. The illustrated apparatus has been operated at through-put rates of between 500 and 5,000 components per hour.

While the present invention has been particularly shown and described with reference to a particular preferred embodiment, it will be appreciated by those skilled in the art that various alterations and modifications in form and detail may be made thereto without departing from the invention. Accordingly, the appended claims are to be interpreted as covering all such alterations and modifications as fall within the true spirit and scope of the invention.

What is claimed is:

1. Apparatus for processing electronic components such as transistors and the like having a body with a plurality of leads aligned in a row and extending therefrom, comprising:

an elongated guide means forming a transistor body passageway extending between an entry end and an exit end and having a single slot along the length of its bottom side through which the transistor leads project, the width of said slot being only slightly wider than the width of one of said leads, said entry end being elevated relative to said exit end and said passageway extending through a work station;

metering means disposed along the length of said guide means between said entry end and the work station for feeding transistors one-at-a-time to the work station;

positioning means disposed at the work station for receiving and causing each transistor fed thereto to be stopped and positioned with a predetermined orientation;

a die assembly disposed at the work station beneath and on one side of said guide means and movable between a retracted position and a lead engaging position, said die assembly including a die plate having a lead receiving notch in one edge thereof, a pair of pivotable lead engaging members lying beneath said die plate with one end of each member positioned proximate said notch, and a lead length determining shoulder lying beneath the ends of said pivotable members;

a forming and cutting assembly disposed at the work station beneath and on the opposite side of said guide means relative to said die assembly and movable between a retracted position and a working position, said forming and cutting assembly including a forming member for mating with said die plate and said pivotable members to form said leads into a predetermined configuration, and a cutting element having a shearing edge for cooperating with said shoulder to trim the formed leads to a predetermined length, said cutting element including an elongated member having an upper surface terminating in said shearing edge on the side nearest said die assembly means, and said forming member including a body portion slideably mounted to said surface and a shaping element formed on the side of said body portion nearest said die assembly for engaging said ends of said pivotable members and deforming the leads beneath said notch, and means urging said body portion into a position with said shaping element extending over said cutting edge when said forming and cutting assembly is in said retracted position but permitting said cutting element to move relative to said forming member a predetermined distance in the direction of said die assembly after said forming member has mated with said die assembly; and actuating means for actuating said metering means to feed a transistor to the work station, for actuating said positioning means to receive and position the fed transistor, and for then simultaneously actuating said die assembly means and said forming and cutting assembly means to form and trim the leads of the transistor.

2. Apparatus as recited in claim 1 wherein said metering means, said positioning means, and said forming and cutting assembly are pneumatically actuated and said actuating means includes pneumatic sequencer.

3. Apparatus as recited in claim 2 wherein said actuating means further includes a motor for driving said pneumatic sequencer, said motor having a cam affixed to its drive shaft for driving said die assembly.

4. Apparatus as recited in claim 1 wherein said positioning means includes a first detent for engaging the top surface of the transistor body and a second detent for engaging a side surface of the transistor body, the transistor body engaging end of said second detent being of a concave configuration.

5. Apparatus as recited in claim 4 wherein said positioning means further includes a third detent forming a stop for blocking passage of a transistor through said passageway, said first, second and third detents being actuated in inverse order to position a transistor at the work station.

6. Apparatus as recited in claim 1 wherein said metering means includes a pair of alternatingly actuated detents which are separated by the width of the transistor body and which when actuated project into said passageway to position a transistor body therebetween.

* * * * *